(12) United States Patent
Takaba

(10) Patent No.: US 8,399,366 B1
(45) Date of Patent: Mar. 19, 2013

(54) METHOD OF DEPOSITING HIGHLY CONFORMAL AMORPHOUS CARBON FILMS OVER RAISED FEATURES

(75) Inventor: Hiroyuki Takaba, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/217,813

(22) Filed: Aug. 25, 2011

(51) Int. Cl.
*H01L 21/31* (2006.01)
(52) U.S. Cl. ............ 438/778; 257/E23.117; 257/E21.27
(58) Field of Classification Search .................. 438/778; 257/E23.117, E21.27
See application file for complete search history.

(56) References Cited

U.S. PATENT DOCUMENTS

| | | | | |
|---|---|---|---|---|
| 7,842,622 B1 * | 11/2010 | Lee et al. | ...................... | 438/780 |
| 2005/0202683 A1 | 9/2005 | Wang et al. | | |
| 2007/0286954 A1 * | 12/2007 | Tang et al. | ................. | 427/249.1 |
| 2008/0153311 A1 * | 6/2008 | Padhi et al. | .................... | 438/780 |
| 2009/0011602 A1 * | 1/2009 | Nozawa et al. | ............... | 438/694 |
| 2009/0314629 A1 * | 12/2009 | Nishimoto | ..................... | 204/164 |
| 2010/0032838 A1 | 2/2010 | Kikuchi et al. | | |
| 2010/0062612 A1 | 3/2010 | Ishikawa | | |

OTHER PUBLICATIONS

Ishikawa, H et al., "Evaluation of New Amorphous Hydrocarbon Film for Copper Barrier Dielectric Film in Low-k Copper Metallization," Japanese Journal of Applied Physics, vol. 47, No. 4, 2008, pp. 2531-2534.

* cited by examiner

*Primary Examiner* — Kevin Parendo

(57) ABSTRACT

A method is provided for forming a semiconductor device. The method includes providing a substrate on a substrate holder in a process chamber, where the substrate contains a raised feature having a top surface and a sidewall surface, and flowing a process gas into the process chamber, where the process gas contains a hydrocarbon gas, an oxygen-containing gas, and optionally argon or helium. The method further includes maintaining a process gas pressure of at least 1 Torr in the process chamber, forming a plasma from the process gas using a microwave plasma source, and exposing the substrate to the plasma to deposit a conformal amorphous carbon film over the surfaces of the raised feature.

19 Claims, 6 Drawing Sheets

METHOD OF DEPOSITING HIGHLY CONFORMAL AMORPHOUS CARBON FILMS OVER RAISED FEATURES

FIELD OF THE INVENTION

The present invention relates to a method for fabricating a semiconductor device, and more particularly, to depositing highly conformal amorphous carbon films over raised features.

BACKGROUND OF THE INVENTION

There is a need in semiconductor manufacturing for new methods for low temperature deposition of conformal carbon films over raised features found in advanced devices. Existing methods for depositing carbon films include plasma-enhanced chemical vapor deposition (PECVD) that suffers from non-conformal deposition over the raised features, where the carbon films are preferentially deposited on top of the raised features and in the field area between the raised features, with little carbon film deposition on sidewalls of the raised features.

SUMMARY OF THE INVENTION

Embodiments of the invention provide processing methods for depositing highly conformal amorphous carbon films over raised features on a substrate. In one example, the conformal carbon films may be patterned and used as hard masks for etching features into underlying material layers or into the substrate.

According to one embodiment of the invention, the method includes providing a substrate on a substrate holder in a process chamber, where the substrate contains a raised feature having a top surface and a sidewall surface, flowing a process gas into the process chamber, wherein the process gas contains a hydrocarbon gas, an oxygen-containing gas, and optionally argon or helium, maintaining a gas pressure of the process gas in the process chamber that is equal to or greater than 1 Torr, and forming a plasma from the process gas using a microwave plasma source. The method further includes exposing the substrate to the plasma to deposit a conformal amorphous carbon film over the top surface and the sidewall surface of the raised feature, where a ratio of the thickness of the conformal amorphous carbon film on the top surface thickness to the thickness of the conformal amorphous carbon film on the sidewall surface (d(top)/d(sidewall)) is less than 2.

According to another embodiment, the method includes providing a substrate on a substrate holder in a process chamber, where the substrate contains a raised feature having a top surface and a sidewall surface, flowing a process gas containing a continuous flow of an oxygen-containing gas and optionally argon or helium, and a pulsed flow of a hydrocarbon gas, maintaining a process gas pressure of at least 1 Torr in the process chamber, and forming a plasma from the process gas using a microwave plasma source containing a radial line slot antenna (RLSA) facing the substrate, where the hydrocarbon gas includes a carbon-carbon triple chemical bond that is not broken by the plasma excitation. The method further includes exposing the substrate to the plasma to deposit a conformal amorphous carbon film over the surfaces of the raised feature, wherein a ratio of the thickness of the conformal amorphous carbon film on the top surface thickness to the thickness of the conformal amorphous carbon film on the sidewall surface (d(top)/d(sidewall)) is less than 2.

DETAILED DESCRIPTION OF SEVERAL EMBODIMENTS

Embodiments of the invention are described with reference to the accompanying drawings, in which exemplary embodiments of the invention are shown. The ensuing description is not intended to limit the scope, applicability or configuration of the disclosure. Rather, the ensuing description of several exemplary embodiments will provide those skilled in the art with an enabling description for implementing exemplary embodiments of the invention. It should be noted that embodiments of the invention may be embodied in different forms without departing from the spirit and scope of the invention as set forth in the appended claims.

Embodiments of the invention are directed to processing methods for depositing conformal amorphous carbon films over raised features on a substrate. Conventional plasma deposition methods (e.g., PECVD) for depositing amorphous carbon films over raised features suffer from non-conformal deposition characteristics. The non-conformal deposition results in preferential line-of-sight carbon deposition on top surfaces of the raised features and on the surfaces between the raised features, and reduced carbon deposition on the sidewalls of the raised features.

Figure 1A:
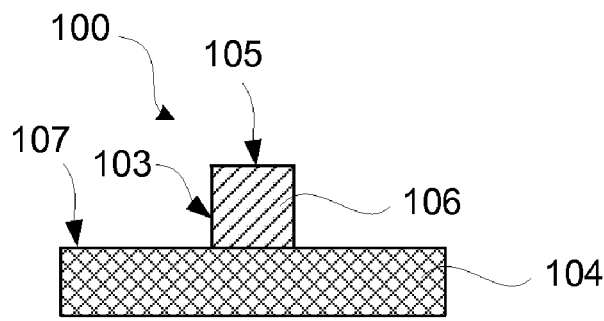
FIGS. 1A-1C schematically show deposition of a conformal amorphous carbon film over a raised feature on a substrate and subsequent formation of a patterned carbon hard mask according to an embodiment of the invention.
Figure 1B:
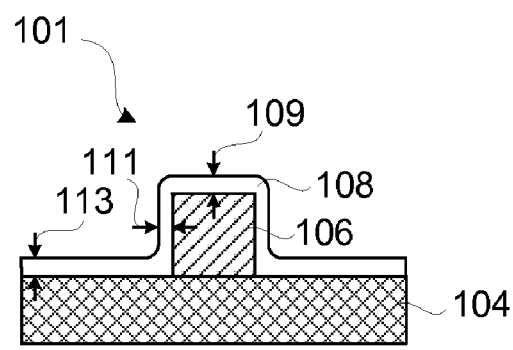
Figure 1C:
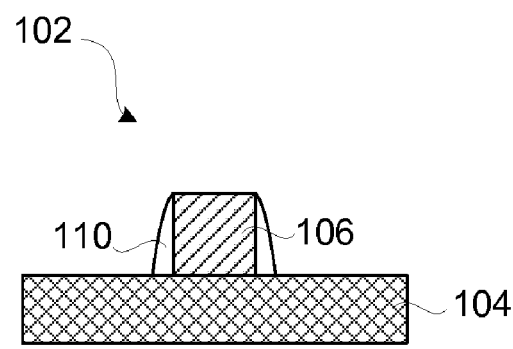
Figure 2:
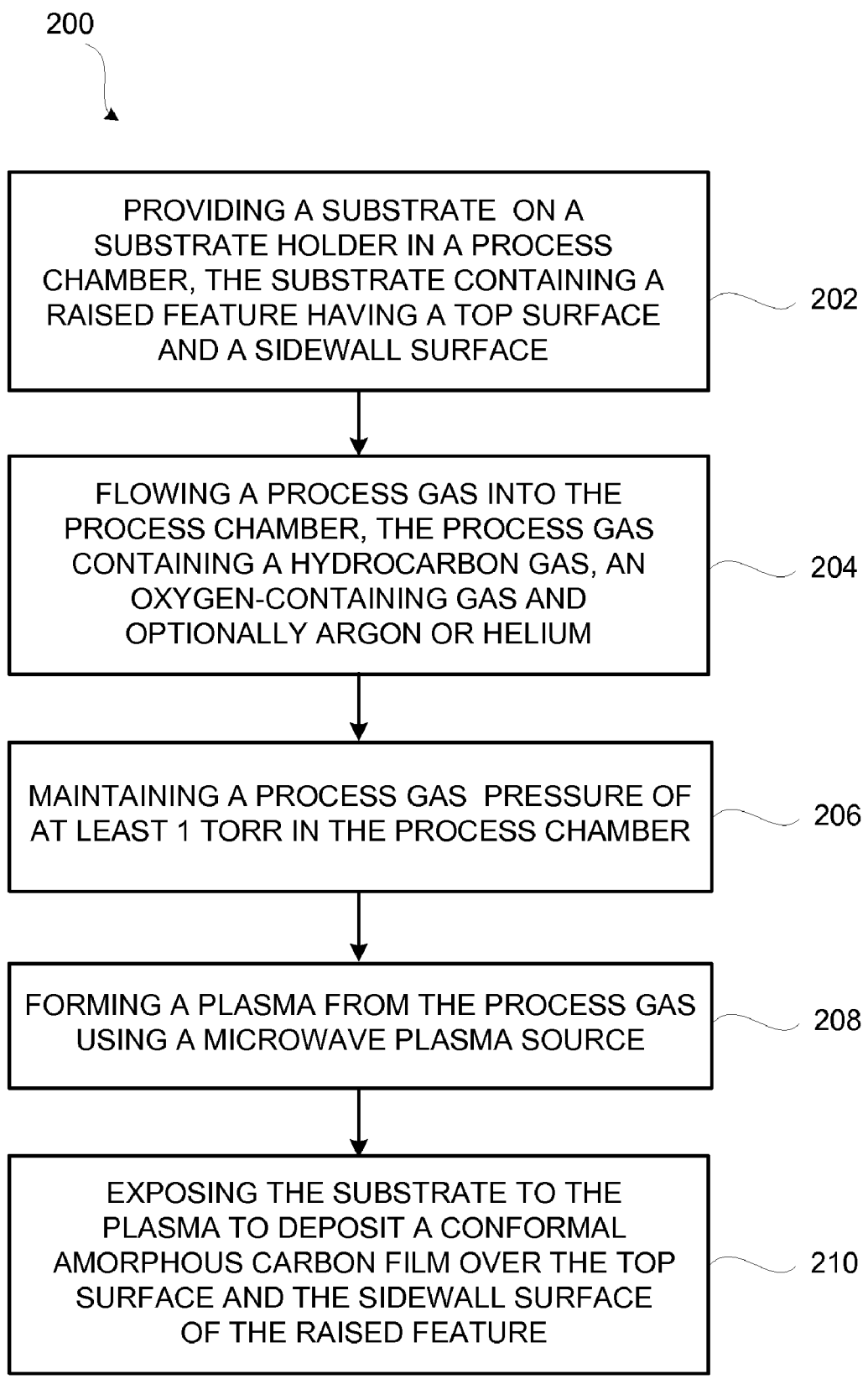
FIG. 2 depicts a flow diagram of a method of depositing a conformal amorphous carbon film over a raised feature on a substrate according to an embodiment of the invention.

FIGS. 1A-1C schematically show deposition of a conformal amorphous carbon film over a raised feature on a substrate and subsequent formation of a patterned carbon hard mask according to an embodiment of the invention, and FIG. 2 depicts a flow diagram 200 of a method of depositing a conformal amorphous carbon film over a raised feature on a substrate according to an embodiment of the invention.

In 202, a structure 100 containing a substrate 104 with a field surface 107 and a raised feature 106 having a top surface 105 and a sidewall surface 103 is provided on a substrate holder in a process chamber. According to one embodiment of the invention, the process chamber can be a part of the plasma processing system containing a radial line slot antenna (RLSA) plasma source depicted in FIG. 5. The substrate 104 can, for example, contain silicon (Si). The raised feature 106 can, for example, contain Si and may be formed using various lithographic and etching methods known to those skilled in the art. According to some examples, the raised feature 106 can have a width that is less than 100 nm, less than 50 nm, less than 30 nm, or less than 20 nm, for example. In some examples the raised feature can have an aspect ratio (height/width) of greater than 0.5, greater than 1, greater than 2, greater than 3, greater than 5, or greater than 10, for example.

In 204, a process gas containing a hydrocarbon gas, an oxygen-containing gas, and optionally argon or helium, is flowed into the process chamber. The hydrocarbon gas has a general formula $C_xH_y$, and can include $C_4H_4$, $C_4H_6$, $C_6H_6$, or a combination thereof. According to one embodiment, the hydrocarbon gas can include a molecule containing a carbon-carbon triple bond (CC), for example $C_4H_6$ (1-butyne or 2-butyne). In some embodiments, the carbon-carbon triple chemical bond is not broken by the plasma excitation and this is thought to increase the extent of isotropic deposition into the amorphous carbon film. The oxygen-containing gas can contain $O_2$, $H_2O$, or both $O_2$ and $H_2O$. In one example, the process gas can contain or consist of a $C_4H_6$ gas, $O_2$, and optionally argon or helium. In some examples, a flow rate of the argon or helium gas can be between 100 standard cubic centimeters per minute (sccm) and 500 sccm, between 500 sccm and 1000 sccm, between 1000 sccm and 2000 sccm, between 2000 sccm and 3000 sccm, between 3000 sccm and 4000 sccm, or greater than 4000 sccm. In some examples, a flow rate the hydrocarbon gas can be between 10 sccm and 200 sccm, for example between 40 sccm and 60 sccm, between 60 sccm and 80 sccm, between 80 sccm and 100 sccm, or greater than 100 sccm. In some examples, a flow rate of the oxygen-containing gas can be between 10 sccm and 100 sccm, for example between 10 sccm and 40 sccm or between 40 sccm and 100 sccm.

In 206, a process gas pressure of at least 1 Torr is maintained in the process chamber. The inventors have discovered that using a process gas pressure greater than 300 mTorr, for example at least 1 Torr can prevent formation of cracks in amorphous carbon film near the bottom of the sidewall surface 103 and results in improved film deposition rate on the sidewall surface 103. Further, in the case of a hydrocarbon gas containing a carbon-carbon triple bond (e.g. $C_4H_6$), it is speculated that the addition of the oxygen-containing gas to the process gas increases formation of hydrocarbon radicals by the plasma in the process chamber. The increased formation of hydrocarbon radicals in the process chamber is thought to increase the isotropic character of the film deposition process and thus increase the conformality of the deposited amorphous carbon film. The process gas pressure in the process chamber may be accurately controlled by a pressure controller valve connected to an exhaust line and to a vacuum pump. In some examples, the process gas pressure can be between 1 Torr and 10 Torr, between 1 Torr and 5 Torr, between 2 Torr and 4 Torr, between 1 Torr and 2 Torr, between 2 Torr and 3 Torr, between 3 Torr and 4 Torr, between 4 Torr and 5 Torr, or greater than 5 Torr.

In 208, a plasma is formed from the process gas in the process chamber using a microwave plasma source. The plasma source can include RLSA plasma source located in the process chamber and capable of generating microwave power between 1000 W and 5000 W, for example between 1000 W and 2000 W, between 2000 W and 3000 W, between 3000 W and 4000 W, or between 4000 W and 5000 W.

In 210, the substrate 104 and the raised feature 106 is exposed to the plasma to deposit a conformal amorphous carbon film over the surfaces of the raised feature 106. FIG. 1B shows a structure 101 containing a conformal amorphous carbon film 108 deposited over the structure 100 in FIG. 1A. The conformal amorphous carbon film 108 has a thickness 113 on the field surface 107 of substrate 104, a thicknesses 111 on the sidewall surface 103 of the raised feature 106, and a thickness 109 on the top surface 105 of the raised feature 106. In some examples, one or more of the thicknesses 109, 111, 113 can be between 5 nm and 100 nm, for example between 5 nm and 10 nm, between 20 nm and 30 nm, between 30 nm and 50 nm, or between 50 nm and 100 nm. According to embodiments of the invention, a ratio of the thicknesses 109 and 111 (d(top)/d(sidewall)) is less than 2, less than 1.5, or less than 1.3, for example about 1.2.

FIG. 1C shows a structure 102 formed by anisotropic etching of the structure 101 in FIG. 1B. In this example, the conformal amorphous carbon film 108 is patterned using an anisotropic plasma etch process and the patterned amorphous carbon film 110 may be used as a hard mask for etching features into the underlying substrate 104. Thereafter, the patterned amorphous carbon film 110 may easily be removed using well-known ashing processes.

Figure 3A:
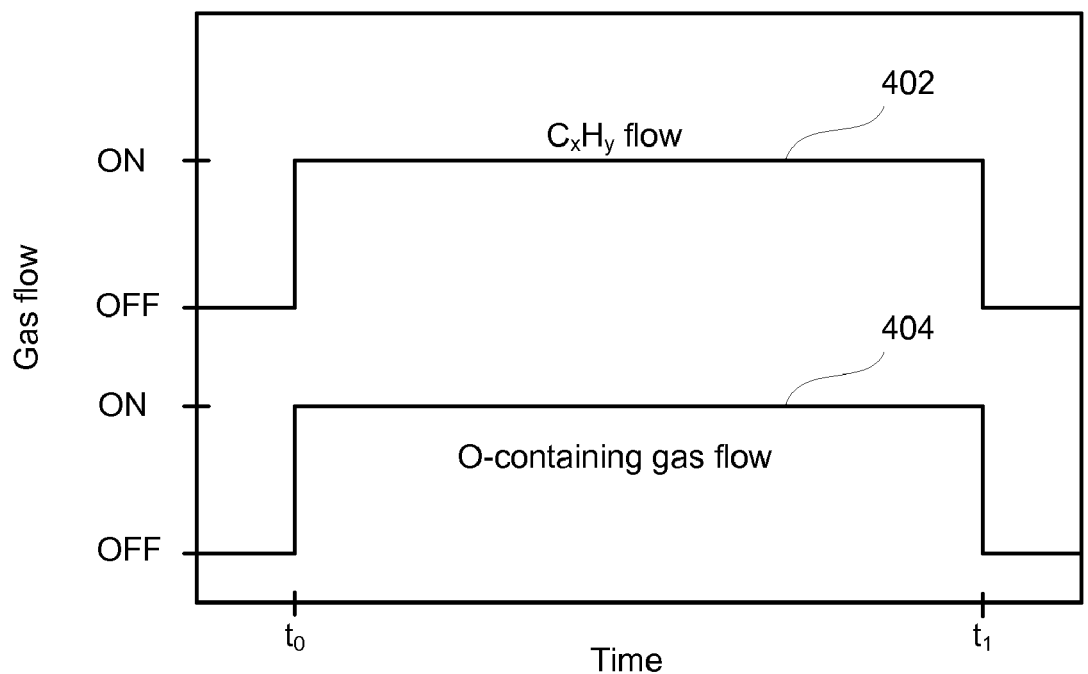
FIGS. 3A and 3B show gas flow diagrams for depositing a conformal carbon film over a raised feature on a substrate according to embodiments of the invention.
Figure 3B:
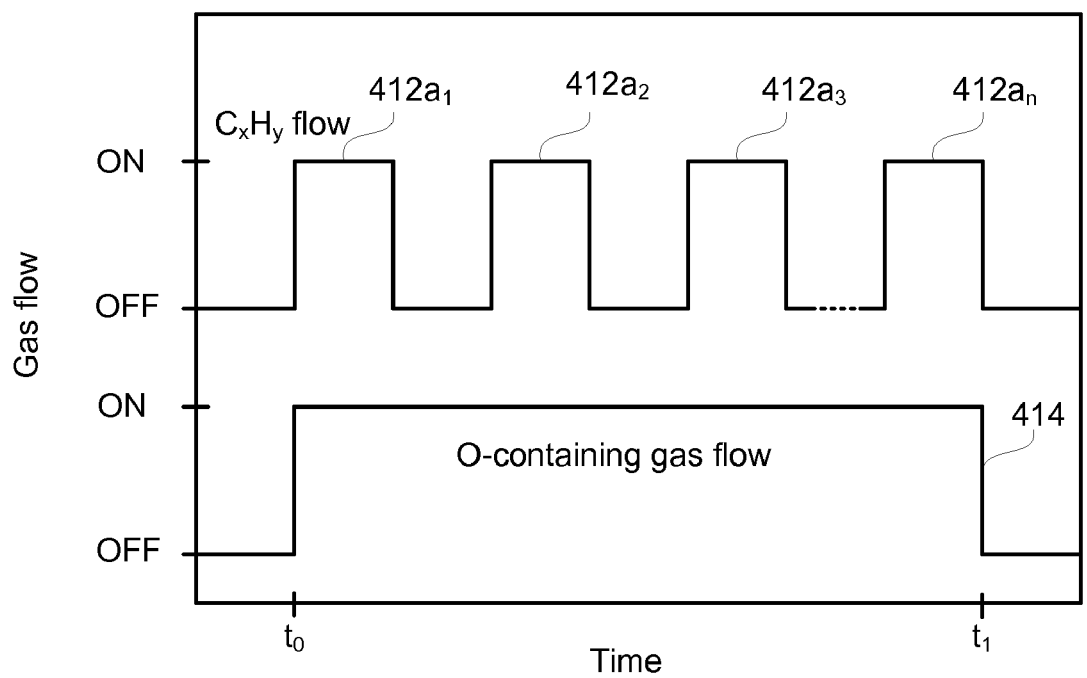

FIGS. 3A and 3B show gas flow diagrams for depositing a conformal amorphous carbon film over a raised feature on a substrate according to embodiments of the invention. The gas flow diagram in FIG. 3A includes constant or substantially constant gas flows 402 and 404 of a hydrocarbon gas and an oxygen-containing gas, respectively. Although not shown in FIG. 3A, a constant or substantially constant gas flow of Ar or He may be used. The film deposition starts at time $t_0$ and ends at time $t_1$. Exemplary deposition times can be between about 10 seconds and about 120 seconds, for example between about 10 seconds and about 30 seconds, between about 30 seconds and about 60 seconds, or between about 60 seconds and about 120 seconds. The gas flow diagram in FIG. 3B includes constant or substantially constant gas flow 414 of an oxygen-containing gas and sequential pulses $412a_1$, $412a_2$, $412a_3$, ..., $412a_n$ of a hydrocarbon gas. In some examples, the number of pulses of the hydrocarbon gas can be between about 10 and about 50, between about 50 and about 100, between about 100 and about 200, or greater than 200. In some examples, the pulse length can be between about 0.1 seconds and about 30 seconds, or between about 1 second and about 20 seconds.

Figure 4:
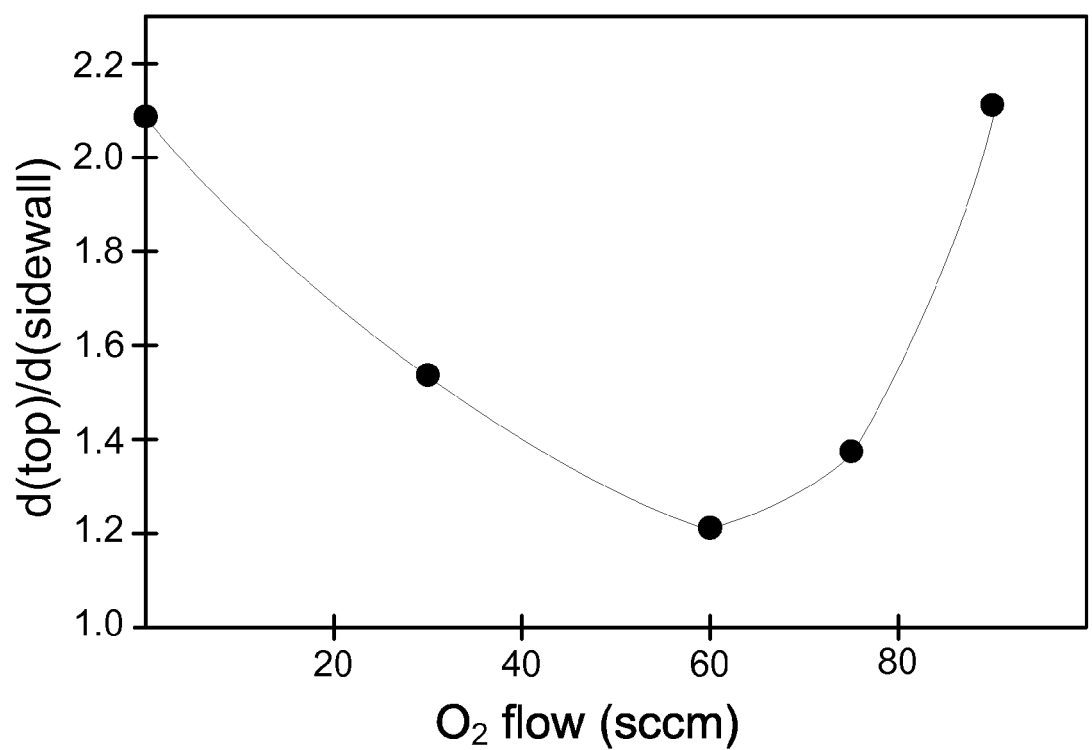
FIG. 4 shows carbon film conformality as a function of $O_2$ gas flow.

FIG. 4 shows carbon film conformality as a function of $O_2$ gas flow. Referring back to FIGS. 1A and 1B, the level of carbon film conformality value is expressed as d(top)/d(sidewall), where a conformality of 1.0 indicates equal thickness of the amorphous carbon film 108 on the top surface 105 of the raised feature 106 and on the sidewall surface 103 of the raised feature 106. The amorphous carbon films had a thickness between about 10 nm and about 20 nm and were deposited over raised features having a width and height of about 80 nm. The process gas consisted of $C_4H_6$, $O_2$, and Ar. The gas flow rate of $C_4H_6$ was about 80 sccm, the gas flow rate of Ar was about 2500 sccm, and the gas flow rate of $O_2$ was varied from about 0 sccm to about 90 sccm. The carbon film conformality values over the raised feature ranged from greater than 2 for an $O_2$ flow of 0 sccm, greater than 1.5 for a low $O_2$ gas flow (30 sccm), about 1.2 at a medium $O_2$ gas flow (60 sccm), and greater than 2 for a high $O_2$ gas flow (90 sccm).

In FIG. 4, the high carbon film conformality values for the low and high $O_2$ gas flows demonstrate poor carbon film conformality over the raised features. At zero or low $O_2$ gas flows, the poor carbon film conformality is thought to be due to low levels of oxygen-assisted decomposition of the hydrocarbon gas. At high $O_2$ gas flows, the poor carbon film conformality is thought to be due competing film deposition and film etching that results in low net deposition rate the amorphous carbon film. In contrast, the medium $O_2$ gas flows provided high levels of decomposition of the hydrocarbon gas and low levels of film etching, resulting in excellent carbon film conformality.

Figure 5:
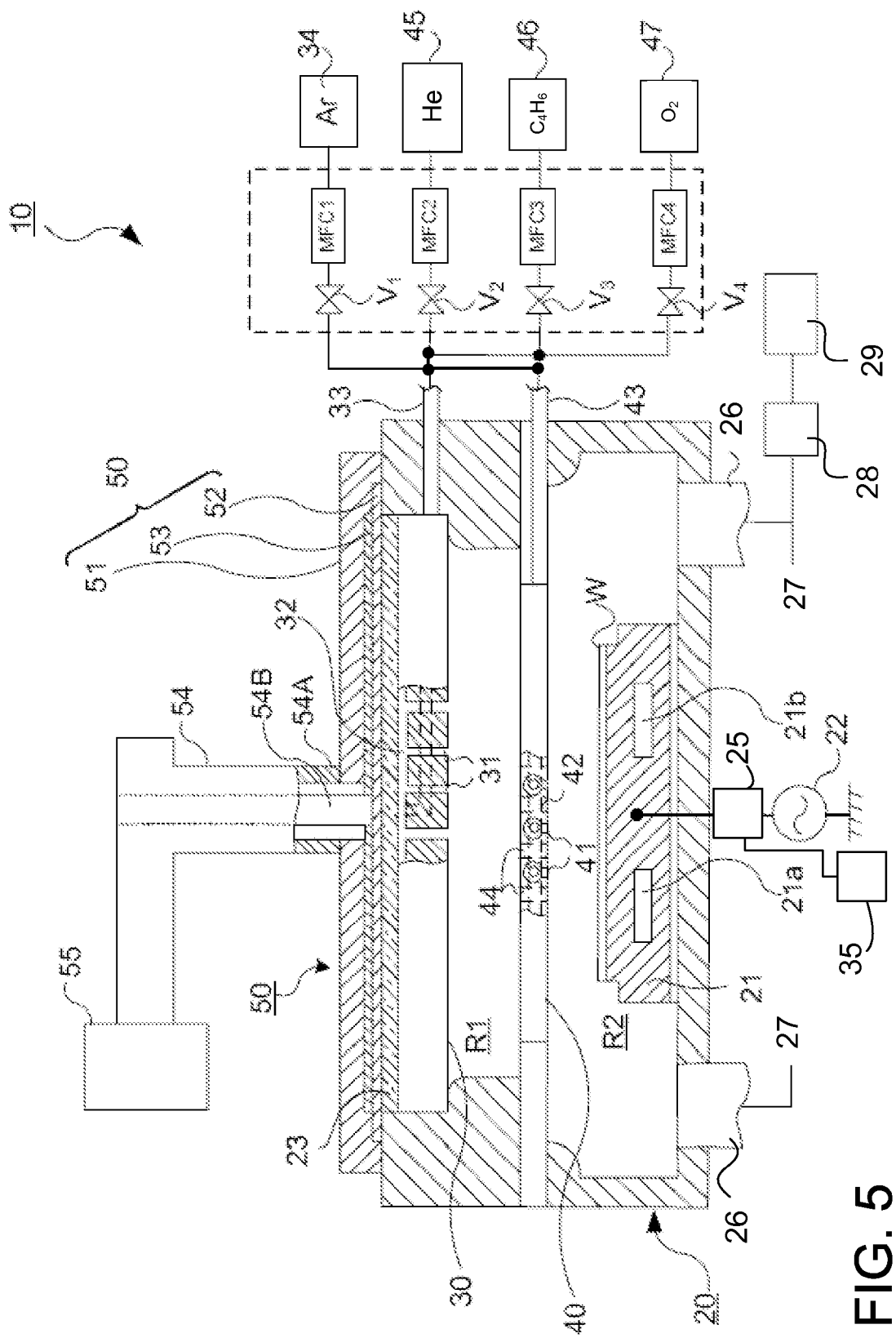
FIG. 5 is a schematic diagram of a plasma processing system containing a radial line slot antenna (RLSA) plasma source for depositing a conformal amorphous carbon film on a substrate according to one embodiment of the invention.

FIG. 5 is a schematic diagram of a plasma processing system containing a radial line slot antenna (RLSA) plasma source for depositing a conformal amorphous carbon film on a substrate according to one embodiment of the invention. As shown in this figure, the plasma processing system 10 includes a process chamber 20 (vacuum chamber), an antenna unit 50 (RLSA), and a substrate holder 21. The interior of process chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, where the film formation process is performed, the electron temperature of the plasma near the substrate holder 21 drops to a value of lower than about 2 eV. The substrate holder 21 is located centrally on a bottom portion of the process chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the process chamber 20 is opened-ended. The plasma gas supply unit 30 is placed opposite to the substrate holder 21 and is attached to the top portion of the process chamber 20 via sealing members, not shown in this figure, such as O rings. The plasma gas supply unit 30, which may also function as a dielectric window, is made of materials such as, for example, aluminum oxide or quartz and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. Plasma gas supply sources 34 and 45 provide plasma gas such as, for example, Argon (Ar) gas, Helium (He) gas, Krypton (Kr) gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is located substantially at the center of the process chamber 20 between the plasma generation region R1 and the plasma diffusion region R2. The process gas supply unit 40 is made of conducting materials such as, for example, aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a virtual disk shape.

The process chamber 20 further includes an exhaust lines 26 connected to the bottom portion of the process chamber 20, a vacuum line 27 connecting the exhaust line to a pressure control valve 28 and to a vacuum pump 29. The pressure control valve 28 may be used to achieve a desired gas pressure in the process chamber 20.

Figure 6:
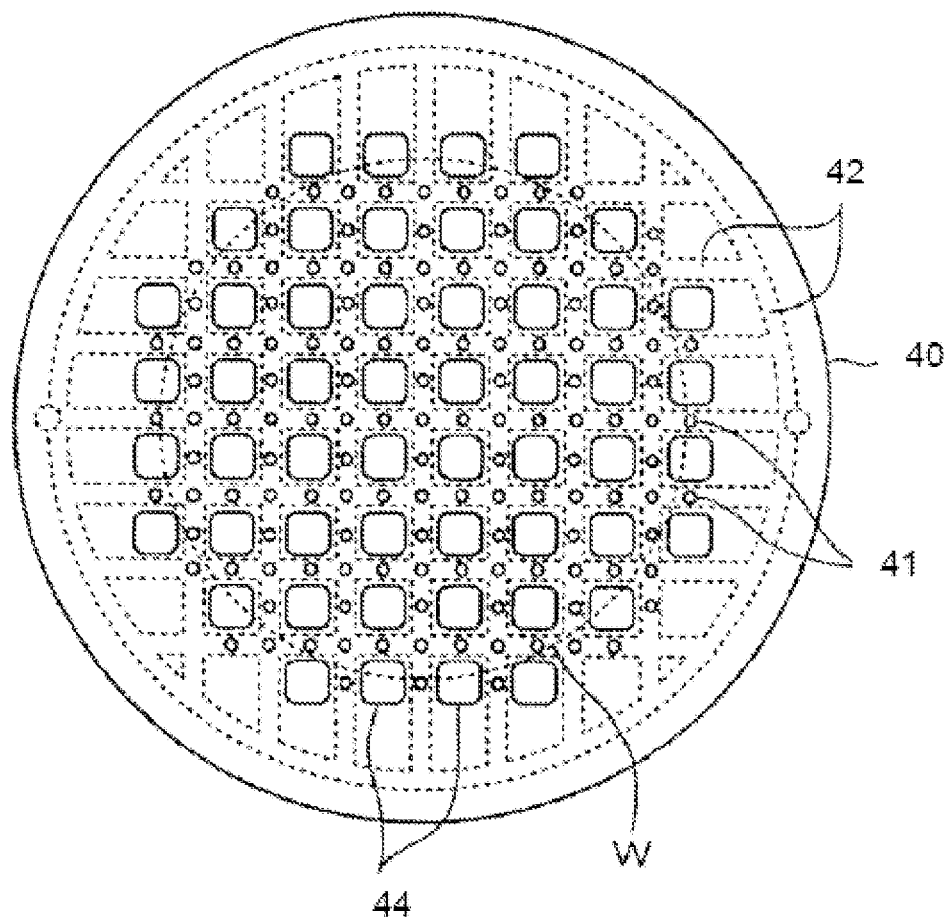
FIG. 6 illustrates a plan view of a gas supplying unit of the plasma processing system in FIG. 5.

A plan view of the process gas supply unit 40 is shown in FIG. 6. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the mounting table 21. Similar to the previous case, the plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., argon (Ar) gas, helium (He) gas, or other inert gases, into the plasma diffusion region R2 at the mounting table 21 side. As shown in FIG. 6, the plurality of opening 44 is formed between the adjacent gas flow channels 42.

The process gas is supplied, for example, from two separate process gas supply source 46-47 to the process gas supply port 43. The process gas supply sources 46-47 correspond respectively to a hydrocarbon gas (e.g., $C_4H_6$), and an oxygen-containing gas (e.g., $O_2$). The flow rate of the plasma gas, e.g., Ar gas, can range from about 100 sccm to about 4000 sccm. The flow rate of the oxygen-containing gas, e.g. $O_2$, can range from about 10 sccm to about 100 sccm. The flow rate of a hydrocarbon gas, e.g. $C_4H_6$, can range between about 20 sccm and about 200 sccm. A more detailed list of gases that may be used as the plasma gas and the process gas is described above in reference to FIG. 2. Further, a more detailed description of process parameters that may be used, including process chamber pressure and substrate temperature, is described above in reference to FIG. 2.

The one or more of the plasma gas, hydrocarbon gas, and the oxygen-containing gas flow through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the plasma gas, hydrocarbon gas, and the oxygen-containing gas.

An external microwave generator 55 provides a microwave signal of a predetermined frequency, e.g., 2.45 GHz, to the antenna unit 50 via a coaxial waveguide 54. The coaxial waveguide 54 may include an inner conductor 54B and an outer conductor 54A. The microwave energy from the microwave generator 55 generates an electric field just below the plasma gas supply unit 30, in the plasma generation region R1, which in turn causes excitation of the plasma gas, e.g., Ar gas, He gas, or other inert gases, within the process chamber 20.

Figure 7:
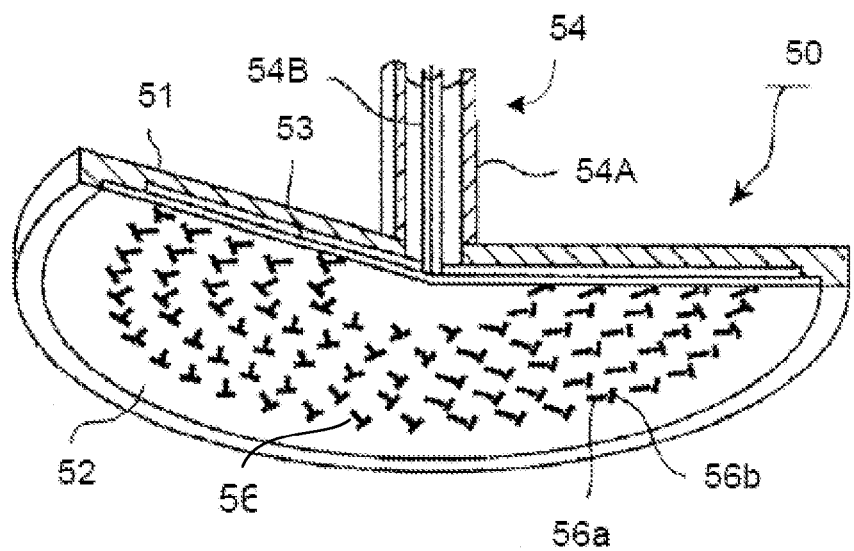
FIG. 7 illustrates a partial cross-sectional view of an antenna portion of the plasma processing system in FIG. 5.

FIG. 7 illustrates a partial cross-sectional view of the antenna unit 50 (RLSA). As shown in this figure, the antenna unit 50 may include a flat antenna main body 51, a radial line slot plate 52, and a dielectric plate 53 to shorten the wavelength of the microwave signal. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 are provided on the radial line slot plate 52 to generate a circularly polarized wave. The plurality of slots 56 are arranged in a substantially T-shaped form having a slight gap there between, in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. As shown in FIG. 5, the radial line slot plate 52 is mounted on the process chamber 20 using sealing members, not shown in FIG. 5, such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

Referring to FIG. 5, an external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Exemplary RF bias power can be between about 100 W and about 200 W, between about 200 W and about 300 W, between about 300 W and about 400 W, or between about 400 W and about 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes a DC voltage generator 35 capable of optionally supplying DC voltage bias between about −5 kV and about +5 kV to the substrate holder 21.

During the forming of the conformal amorphous carbon film, the plasma gas, e.g., Ar gas, may be introduced into the process chamber 20 using the plasma gas supply unit 30. On the other hand, the hydrocarbon gas and the oxygen-containing gas and Ar as a carrier gas may be introduced into the process chamber 20 using the process gas supply unit 40. As shown in FIG. 7, the hydrocarbon gas and the oxygen-containing gas may also be introduced into the process chamber 20 using the plasma gas supply unit 30.

A plurality of embodiments providing processing methods for depositing conformal amorphous carbon film over raised features have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, comprising:
    providing a substrate on a substrate holder in a process chamber, wherein the substrate contains a raised feature having a top surface and a sidewall surface;
    flowing a process gas into the process chamber, wherein the process gas contains a hydrocarbon gas and an oxygen-containing gas, and wherein flowing the process gas includes a continuous flow of the oxygen-containing gas and a flow of the hydrocarbon gas comprising sequential pulses of the hydrocarbon gas;
    maintaining a process gas pressure of at least 1 Torr in the process chamber;
    forming a plasma from the process gas using a microwave plasma source; and
    exposing the substrate to the plasma to deposit a conformal amorphous carbon film over surfaces of the raised feature, wherein a ratio of the thickness of the conformal amorphous carbon film on the top surface to the thickness of the conformal amorphous carbon film on the sidewall surface is less than 2.

2. The method of claim 1, further comprising applying radio frequency (RF) bias power to the substrate holder during the exposing.

3. The method of claim 1, wherein the process gas pressure of the process gas in the process chamber is between 1 Torr and 5 Torr.

4. The method of claim 1, further comprising maintaining a temperature of the substrate holder below 200° C.

5. The method of claim 1, wherein forming the plasma includes exciting the process gas by the microwave plasma source containing a radial line slot antenna (RLSA) facing the substrate.

6. The method of claim 1, wherein the hydrocarbon gas includes a carbon-carbon triple chemical bond that is not broken by plasma excitation.

7. The method of claim 1, wherein the hydrocarbon gas includes $C_4H_4$, $C_4H_6$, $C_6H_6$, or a combination thereof.

8. The method of claim 1, wherein the oxygen-containing gas includes $O_2$, $H_2O$, or both $O_2$ and $H_2O$.

9. The method of claim 1, wherein the process gas comprises $C_4H_6$ and $O_2$.

10. The method of claim 1, wherein the ratio is less than 1.4.

11. The method of claim 1, further comprising:
    etching the conformal amorphous carbon film to form a patterned hard mask.

12. The method of claim 1, wherein the process gas further contains argon, helium, or both argon and helium.

13. A method for forming a semiconductor device, comprising:
    providing a substrate on a substrate holder in a process chamber, wherein the substrate contains a raised feature having a top surface and a sidewall surface;
    flowing a process gas into the process chamber, wherein the process gas contains a continuous flow of an oxygen-containing gas and a flow of a hydrocarbon gas comprising sequential pulses of the hydrocarbon gas;
    maintaining a process gas pressure of at least 1 Torr in the process chamber;
    forming a plasma from the process gas using a microwave plasma source containing a radial line slot antenna (RLSA) facing the substrate, wherein the hydrocarbon gas includes a carbon-carbon triple chemical bond that is not broken by plasma excitation; and
    exposing the substrate to the plasma to deposit a conformal amorphous carbon film over surfaces of the raised feature, wherein a ratio of the thickness of the conformal amorphous carbon film on the top surface to the thickness of the conformal amorphous carbon film on the sidewall surface is less than 2.

14. The method of claim 13, further comprising applying radio frequency (RF) bias power to the substrate holder during the exposing.

15. The method of claim 13, wherein the process gas pressure of the process gas in the process chamber is between 1 Torr and 5 Torr.

16. The method of claim 13, further comprising maintaining a temperature of the substrate holder below 200° C.

17. The method of claim 13, wherein the oxygen-containing gas includes $O_2$, $H_2O$, or both $O_2$ and $H_2O$.

18. The method of claim 13, wherein the process gas comprises $C_4H_6$ and $O_2$.

19. The method of claim 13, wherein the ratio is less than 1.4.

* * * * *